(12) United States Patent
Ochiai

(10) Patent No.: US 10,381,800 B2
(45) Date of Patent: Aug. 13, 2019

(54) SEMICONDUCTOR LASER ELEMENT AND METHOD OF MANUFACTURING THE SAME

(71) Applicant: NICHIA CORPORATION, Anan-shi, Tokushima (JP)

(72) Inventor: Masanao Ochiai, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/975,537

(22) Filed: May 9, 2018

(65) Prior Publication Data

US 2018/0331505 A1 Nov. 15, 2018

(30) Foreign Application Priority Data

May 11, 2017 (JP) ................. 2017-094787

(51) Int. Cl.
*H01S 5/02* (2006.01)
*H01S 5/343* (2006.01)
*H01S 5/183* (2006.01)
*H01S 5/042* (2006.01)
*H01S 5/028* (2006.01)
*H01S 5/22* (2006.01)
(Continued)

(52) U.S. Cl.
CPC .......... *H01S 5/0285* (2013.01); *H01S 5/0014* (2013.01); *H01S 5/0213* (2013.01); *H01S 5/0287* (2013.01); *H01S 5/0425* (2013.01); *H01S 5/18369* (2013.01); *H01S 5/2086* (2013.01); *H01S 5/34333* (2013.01); *H01S 5/0202* (2013.01); *H01S 5/22* (2013.01)

(58) Field of Classification Search
CPC .... H01S 5/0285; H01S 5/0286; H01S 5/0287; H01S 5/18361; H01S 5/18369; H01S 5/34333; H01S 5/0014; H01S 5/0213; H01S 5/0425; H01S 5/0202; H01S 5/22
See application file for complete search history.

(56) References Cited

U.S. PATENT DOCUMENTS 5,282,219 A * 1/1994 Shigihara ............... H01S 5/028
372/49.01
5,497,389 A 3/1996 Kasukawa et al.
(Continued)

FOREIGN PATENT DOCUMENTS

JP H07-074427 A 3/1995
JP H09-129979 A 5/1997
(Continued)

*Primary Examiner* — Armando Rodriguez
(74) *Attorney, Agent, or Firm* — Foley & Lardner LLP

(57) ABSTRACT

A method of manufacturing a semiconductor laser element includes: providing a nitride semiconductor structure with a target emission wavelength $\lambda o$, the nitride semiconductor structure having a light emission-side surface and a light reflection-side surface; forming an emission-side mirror on the light emission-side surface; and forming a reflection-side mirror on the light reflection-side surface. The semiconductor laser element has an actual wavelength $\lambda a$, which is 500 nm or more and is in a range of $\lambda o \pm X$ nm ($5 \leq X \leq 15$). A reflectance of the emission-side mirror is lower than a reflectance of the reflection-side mirror and increases in accordance with an increase in wavelength in a range of $\lambda o \pm X$ nm.

17 Claims, 6 Drawing Sheets

(51) Int. Cl.
*H01S 5/20* (2006.01)
*H01S 5/00* (2006.01)

(56) References Cited

U.S. PATENT DOCUMENTS

| | | |
|---|---|---|
| 2006/0093005 A1 | 5/2006 | Okunuki et al. |
| 2008/0240198 A1 | 10/2008 | Yagi |
| 2009/0213891 A1 | 8/2009 | Nakagawa et al. |
| 2010/0303118 A1 | 12/2010 | Sogabe |

FOREIGN PATENT DOCUMENTS

| | | |
|---|---|---|
| JP | 2004-014997 A | 1/2004 |
| JP | 2006-128475 A | 5/2006 |
| JP | 2007-134627 A | 5/2007 |
| JP | 2008-103407 A | 5/2008 |
| JP | 2008-244300 A | 10/2008 |
| JP | 2009-016684 A | 1/2009 |
| JP | 2009-176812 A | 8/2009 |
| JP | 2010-165704 A | 7/2010 |
| JP | 2010-278096 A | 12/2010 |
| JP | 2011-139110 A | 7/2011 |

* cited by examiner

_US 10,381,800 B2_

SEMICONDUCTOR LASER ELEMENT AND METHOD OF MANUFACTURING THE SAME

CROSS-REFERENCE TO RELATED APPLICATION

The present application claims priority to Japanese Patent Application No. 2017-094787, filed on May 11, 2017, the contents of which are hereby incorporated by reference in their entirety.

BACKGROUND

1. Technical Field

The present disclosure relates to a semiconductor laser element, and a method of manufacturing the semiconductor laser element.

2. Description of Related Art

A known semiconductor laser element includes a semiconductor structure including an active layer, an emission-side mirror disposed on a light emission-side surface of the semiconductor structure, and a reflection-side mirror disposed on a light reflection-side surface of the semiconductor structure. The reflection-side mirror is a film having a high reflectance of, for example, 80% or more, and the emission-side mirror is a film having a lower reflectance. For example, JP 2009-176812 A describes a semiconductor laser element that includes an emission-side mirror having a reflectance in a range of 3 to 13%, and has an emission wavelength of approximately 410 nm.

FIG. 3 in JP 2009-176812 A shows wavelength dependency of the reflectance of an emission-side mirror. According to this figure, the reflectance of the emission-side mirror is almost unchanged even if an actual emission wavelength is deviated from a target value to some extent. Provided that deviation of the emission wavelength does not cause change in the light emitting efficiency of a semiconductor structure, it would be possible to obtain a desired threshold current and optical output even if the actual emission wavelength is deviated to some extent.

However, for example, in a semiconductor laser element configured to emit light in a green region with a wavelength of 500 nm or more, the light emitting efficiency of a semiconductor structure of the semiconductor laser element is not sufficient yet as compared to a semiconductor laser element configured to emit light in an ultraviolet-to-blue region. In such semiconductor laser elements, the longer the emission wavelength is, the lower the light emitting efficiency of the semiconductor structure tends to be. For example, a semiconductor laser element with an emission wavelength in a green region includes an InGaN layer or the like as an active layer. The greater the composition ratio of In in the InGaN layer is, the less the actual uptake amount of In in the InGaN layer is stabilized easily, so that the actual emission wavelength is easily deviated from a target value.

SUMMARY

According to one embodiment of the present invention, a method of manufacturing a semiconductor laser element includes: providing a nitride semiconductor structure with a target emission wavelength $\lambda_o$, the nitride semiconductor structure having a light emission-side surface and a light reflection-side surface; forming an emission-side mirror on the light emission-side surface; and forming a reflection-side mirror on the light reflection-side surface. The semiconductor laser element has an actual wavelength $\lambda_a$, which is 500 nm or more and is in a range of $\lambda_o \pm X$ nm ($5 \leq X \leq 15$). The step of forming the emission-side mirror forming step includes forming an emission-side mirror on the light emission-side surface, the emission-side mirror having a reflectance that is lower than that of the reflection-side mirror and increases in accordance with an increase in wavelength in a range of $\lambda_o \pm X$ nm.

According to one embodiment of the present invention, a semiconductor laser element having an emission wavelength of 500 nm or more, the semiconductor laser element includes: a nitride semiconductor structure having a light emission-side surface and a light reflection-side surface; an emission-side mirror disposed on the light emission-side surface; and a reflection-side mirror disposed on the light reflection-side surface. The emission-side mirror has a reflectance that is lower than the reflectance of the reflection-side mirror and increases in accordance with an increase in wavelength, in a wavelength region with a width of 10 nm to 30 nm including the emission wavelength.

Certain embodiments of the present inventions allows for providing a semiconductor laser element having reduced variations in threshold current, and a method of manufacturing the semiconductor laser element.

DETAILED DESCRIPTION OF EMBODIMENTS

Hereinafter, one embodiment of the present disclosure will be described with reference to the drawings. It is to be noted that the embodiment shown below is intended to illustrate a method of manufacturing to give a concrete form to the technical idea of the present invention, and is not intended to limit the scope of present invention to the following embodiment. Further, in the descriptions below, the same names and numerals denote identical and like members, with detailed descriptions being omitted as appropriate.

Figure 1:
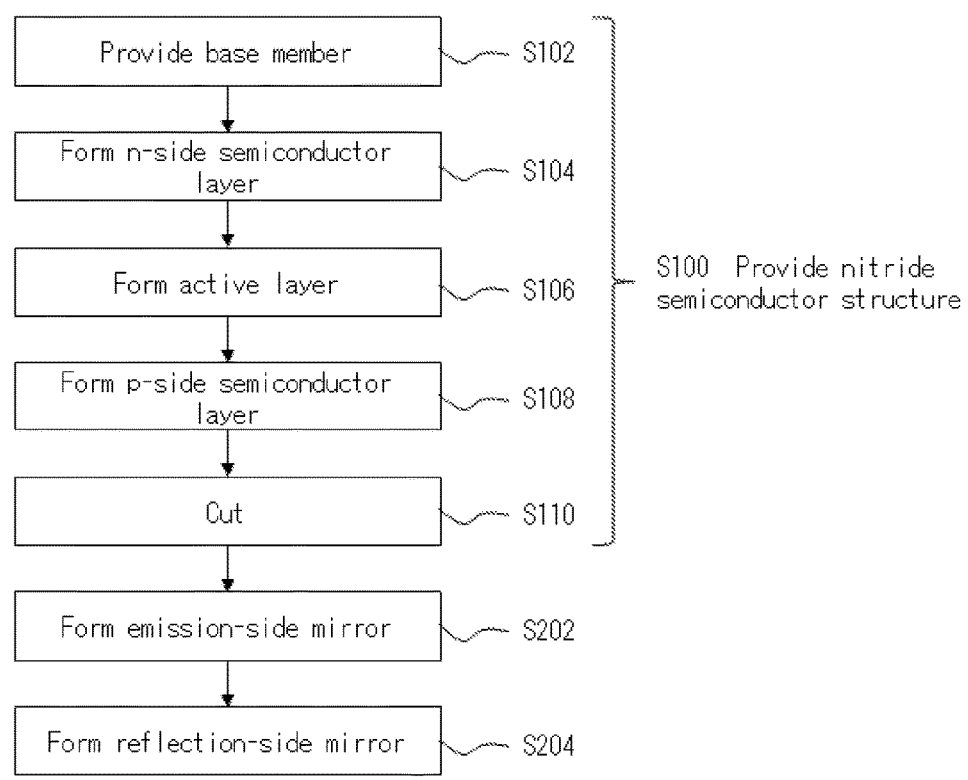
FIG. 1 is a flow chart schematically showing operations of manufacturing according to one embodiment.

As shown in FIG. 1, a method of manufacturing a semiconductor laser element according to the present embodiment includes: S100: providing a nitride semiconductor structure with a target emission-wavelength value of $\lambda o$, the nitride semiconductor structure having a light emission-side surface and a light reflection-side surface; S202: forming an emission-side mirror on the light emission-side surface; and S204: forming a reflection-side mirror on the light reflection-side surface.

The semiconductor laser element has an actual wavelength $\lambda a$, which is 500 nm or more and is in a range of $\lambda o \pm X$ nm ($5 \leq X \leq 15$). In the step of forming the emission-side mirror, an emission-side mirror having a reflectance that is lower than that of the reflection-side mirror and increases in accordance with an increase in wavelength in a range of $\lambda o \pm X$ nm is formed on the light emission-side surface.

Step S100: Providing Nitride Semiconductor Structure

Figure 2:
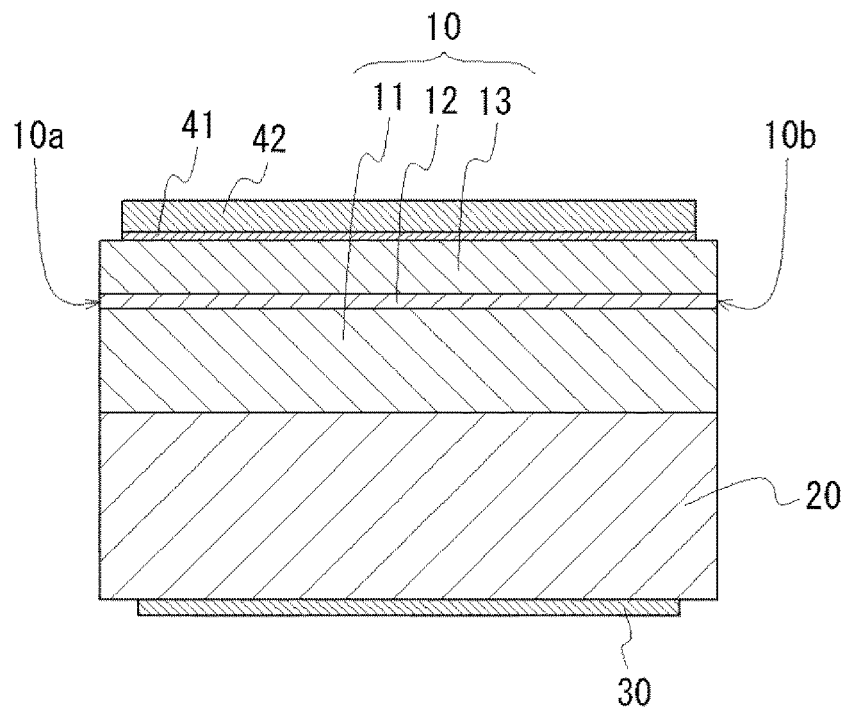
FIG. 2 is a schematic sectional view for illustrating steps of manufacturing a semiconductor laser element according to the embodiment.

A nitride semiconductor structure 10 having a light emission-side surface 10a and a light reflection-side surface 10b as shown in FIG. 2 is provided. As shown in FIG. 1, the step S100 of providing nitride semiconductor structure includes a step S102 of providing a base member, a step S104 of forming an n-side semiconductor layer, a step S106 of forming an active layer, and a step S108 of forming a p-side semiconductor layer forming. As shown in FIG. 2, the nitride semiconductor structure 10 may include an n-side semiconductor layer 11, an active layer 12, and a p-side semiconductor layer 13 in this order in an upward direction. Each of the n-side semiconductor layer 11, the active layer 12 and the p-side semiconductor layer 13 is made of a nitride semiconductor. The nitride semiconductor structure 10 can be formed on a base member 20. FIG. 2 is a cross-sectional view showing a cross-section in a direction parallel to a resonator direction, i.e. a direction parallel to a direction along which a ridge 13a as described later extends.

The nitride semiconductor structure 10 is designed so that a semiconductor laser element formed using the nitride semiconductor structure 10 has a predetermined emission wavelength. As used herein, the targeted predetermined wavelength is referred to as a wavelength $\lambda o$. For example, a targeted composition of a well layer in the active layer 12 when the wavelength $\lambda o$ is 520 nm is, for example, InGaN with an In composition ratio of 25%. If the nitride semiconductor structure 10 having a targeted composition or the like is obtained, the emission wavelength of a semiconductor laser element formed using the nitride semiconductor structure 10 would be the wavelength $\lambda o$, which is a target value. However, the nitride semiconductor structure 10 that is really obtained may not have a composition or the like that exactly matches a target composition or the like, and, in many cases, may have a composition slightly different from a target composition or the like. Similarly, an actual emission wavelength $\lambda a$ may be slightly different from a target wavelength $\lambda o$. If the difference between the actual emission wavelength $\lambda a$ and the target wavelength $\lambda o$ is relatively small, the resulting nitride semiconductor structure can be accepted as a good product. Thus, the actual emission wavelength $\lambda a$ is in a range of $\lambda o \pm X$ nm ($5 \leq X \leq 15$). In the present embodiment, X=15. The semiconductor laser element obtained using the nitride semiconductor structure 10 is a laser element configured to emit green laser light, and the actual emission wavelength $\lambda a$ of the laser element is 500 nm or more. Further, the emission wavelength $\lambda a$ can be in a range of 515 to 540 nm. The "emission wavelength" refers to a peak wavelength.

For the base member 20, a base member made of a semiconductor such as GaN, or a base member made of an insulating material such as sapphire can be used. As the base member 20, for example, a GaN substrate with a c-plane (i.e., (0001) plane) as an upper surface is used. The n-side semiconductor layer 11 may have a multilayer structure made of nitride semiconductors such as GaN, InGaN or AlGaN. Examples of an n-type semiconductor layer that is included in the n-side semiconductor layer 11 include a layer made of a nitride semiconductor containing an n-type impurity such as Si or Ge. The active layer 12 may have a single-quantum well structure or a multiple-quantum well structure. For example, the active layer 12 includes an InGaN well layer and a GaN barrier layer. The p-type semiconductor layer 13 may have a multilayer structure including a nitride semiconductor layer of GaN, InGaN, AlGaN or the like. Examples of the p-type nitride semiconductor layer that is included in the p-side semiconductor layer 13 include a layer made of a nitride semiconductor containing a p-type impurity such as Mg.

An n-electrode 30 can be disposed on a lower surface of the base member 20, as shown in FIG. 2. A p-electrode 41 can be disposed directly on an upper surface of the p-side semiconductor layer 13, and a p-side pad electrode 42 can be disposed on the p-electrode 41. Examples of a material of each of these electrodes include single-layer films or multilayer films of a metal such as Ni, Rh, Cr, Au, W, Pt, Ti, Al, or the like, an alloy thereof, a conductive oxide containing at least one selected from Zn, In and Sn. Examples of the conductive oxide include indium tin oxide (ITO), indium zinc oxide (IZO) and gallium-doped zinc oxide (GZO).

For example, cleaved surfaces are obtained by forming the n-side semiconductor layer 11, the active layer 12 and the p-side semiconductor layer 13 on a wafer-shaped base member 20 in this order and performing cutting, and the obtained cleaved surfaces can serve as a light emission-side surface 10a and a light reflection-side surface 10b.

Step S202: Forming Emission-Side Mirror

Figure 3A:
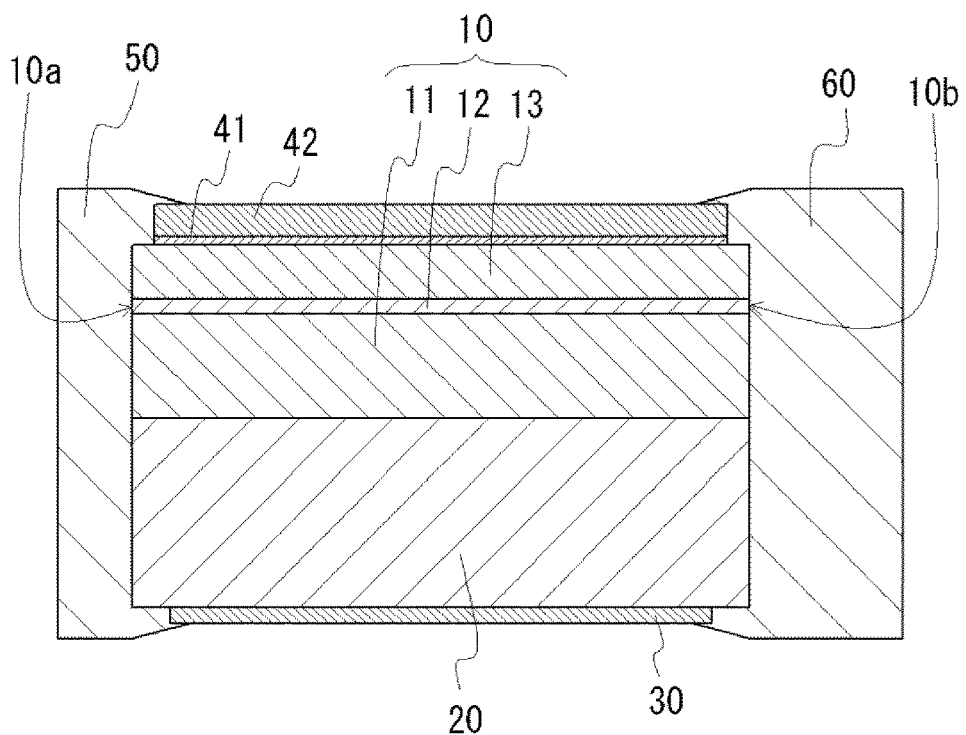
FIG. 3A is a schematic sectional view for illustrating steps of manufacturing a semiconductor laser element according to the embodiment.
Figure 4:
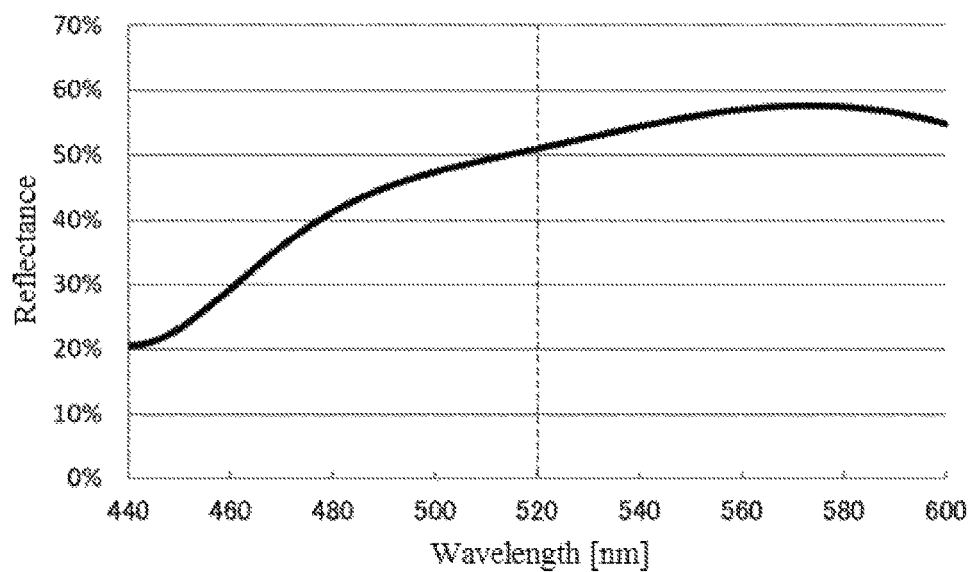
FIG. 4 is a graph showing wavelength dependency of a reflectance of an emission-side mirror in one example.

After the nitride semiconductor structure 10 is provided, an emission-side mirror 50 is formed on the light emission-side surface 10a as shown in FIG. 3A. With respect to a wavelength in a range of $\lambda o \pm X$ nm, a reflectance of the emission-side mirror 50 is lower than that of a reflection-side mirror 60 as will be described below, and increases in accordance with increase in wavelength. FIG. 4 is a graph showing one example of wavelength dependency of the reflectance of the emission-side mirror 50.

As described above, in a semiconductor laser element with an emission wavelength in a green region, the longer the emission wavelength is, the lower the light emitting efficiency of the nitride semiconductor structure 10 tends to be. In view of this, the light emission-side mirror 50 is formed having a reflectance with wavelength dependency as shown in FIG. 4. For example, in the case in which the actual emission wavelength $\lambda a$ is longer than the wavelength $\lambda o$, the light emitting efficiency of the nitride semiconductor structure 10 is reduced, and the reflectance is increased, compared to a case in which the actual emission wavelength $\lambda a$ is equal to the wavelength $\lambda o$.

The threshold current $I_{th}$ in the semiconductor laser element is directly proportional to the threshold current density $J_{th}$. The smaller the light emitting efficiency, i.e. internal quantum efficiency $\eta_i$, of the nitride semiconductor structure 10 is, the greater the threshold current density $J_{th}$ is. In addition, the greater the reflectance of the emission-side mirror 50 is, the smaller the threshold current density $J_{th}$ is. That is, with the actual emission wavelength λa longer than the wavelength λo, light emitting efficiency is reduced, so that the threshold current $I_{th}$ would be increased. On the other hand, however, increase in emission wavelength allows the reflectance of the emission-side mirror 50 to be increased. Therefore, even if the actual wavelength λa is deviated from the wavelength λo, the deviation of the threshold current $I_{th}$ from the target value can be greatly reduced. Accordingly, the yield of the semiconductor laser element can be improved. In addition, there is also an advantage that, the more greatly variations in threshold current are reduced, the more strictly a laser emission-on current and/or a laser emission-off current can be set when the semiconductor laser element is incorporated in an application.

With a small degree of change in reflectance of the emission-side mirror 50 in accordance with an increase in wavelength, an effect of reducing the deviation of the threshold current $I_{th}$ from the target value is hardly obtained. Thus, it is preferable that the emission-side mirror 50 has a reflectance that is changed by 2% or more for every 10 nm increase in wavelength, in a range of λo±X nm. On the other hand, it is considered that, with an excessively large degree of change in reflectance, stable characteristics are hardly obtained, and therefore it is preferable that the reflectance of the emission-side mirror 50 is changed by 10% or less for every 10 nm increase in wavelength. In addition, the light emitting efficiency of the nitride semiconductor structure 10 tends to be generally linearly changed within a range of λo±X nm, and thus it is preferable that the reflectance of the emission-side mirror 50 is also generally linearly changed. In a graph of wavelength dependency of the reflectance of the emission-side mirror 50 as shown in, for example, FIG. 4, there may be substantially no inflection point in a range of λo±X nm.

It is preferable that the emission-side mirror 50 has a reflectance that increases in accordance with an increase in wavelength in wavelength ranges in the vicinity of a range of λo±X nm in addition to the range of λo±X nm. Examples of the wavelength range in the vicinity of a range of λo±X nm include a range of λo±(X+5) nm. In other words, it is preferable that in the graph of wavelength dependency of the reflectance of the emission-side mirror 50, the deflection point is outside the range of λo±(X+5) nm. While deviation of the thickness or refractive index of the emission-side mirror 50 from the target value causes change in the reflectance from the target value, giving a margin to the wavelength range as described above allows for obtaining stable characteristics even if the thickness or the like is deviated to some extent.

Figure 3B:
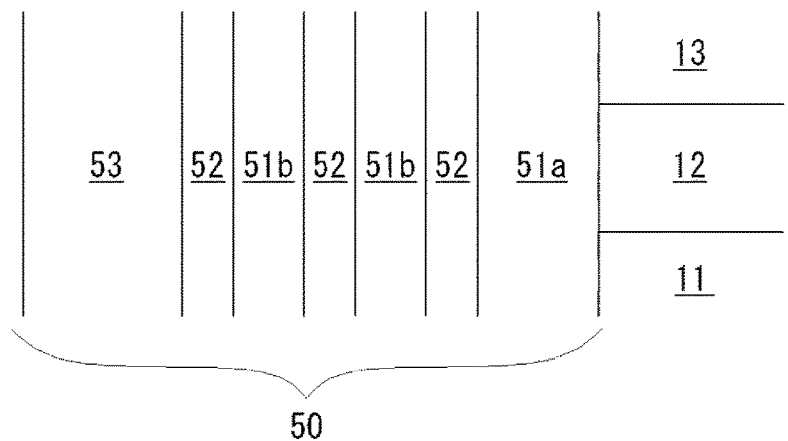
FIG. 3B is a partial enlarged view showing an emission-side mirror and its vicinity.

As shown in FIG. 3B, the emission-side mirror 50 may have a layered structure in which two or more films having different refractive indices are layered. The emission-side mirror 50 is formed by, for example, layering an $Al_2O_3$ film 51a having a thickness of 158 nm, a $ZrO_2$ film 52 having a thickness of 59 nm, an $Al_2O_3$ film 51b having a thickness of 79 nm, a $ZrO_2$ film 52 having a thickness of 59 nm, an $Al_2O_3$ film 51b having a thickness of 79 nm, a $ZrO_2$ film 52 having a thickness of 59 nm and an $Al_2O_3$ film 53 having a thickness of 180 nm, in this order from the light emission-side surface 10a. In the present embodiment, the target wavelength λo is 520 nm, and therefore each of total six layers up to the $ZrO_2$ film 52 from the $Al_2O_3$ film 51a that is in contact with the light emission-side surface 10a is a λ/4 film (quarter-wavelength film) having a thickness that is substantially an integer multiple of λo/4n. The $Al_2O_3$ film 53, which is the outermost film, is a non-λ/4 film (non-quarter-wavelength film) having a thickness that is substantially different from an integer multiple of λo/4n. As used herein, "n" refers to the refractive index of each film. Each of these values is a target value, and an actual thickness may be slightly deviated from the target value. For example, the actual thickness of each film may be deviated from the target value by approximately 0 to 10 nm.

Figure 5:
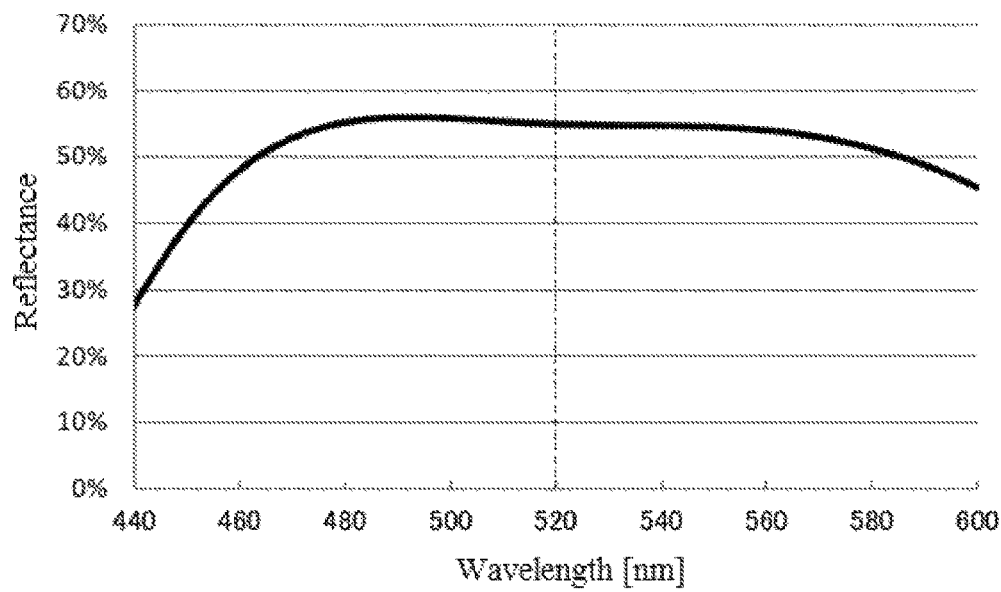
FIG. 5 is a graph showing wavelength dependency of a reflectance of an emission-side mirror in Comparative Example 1.
Figure 6:
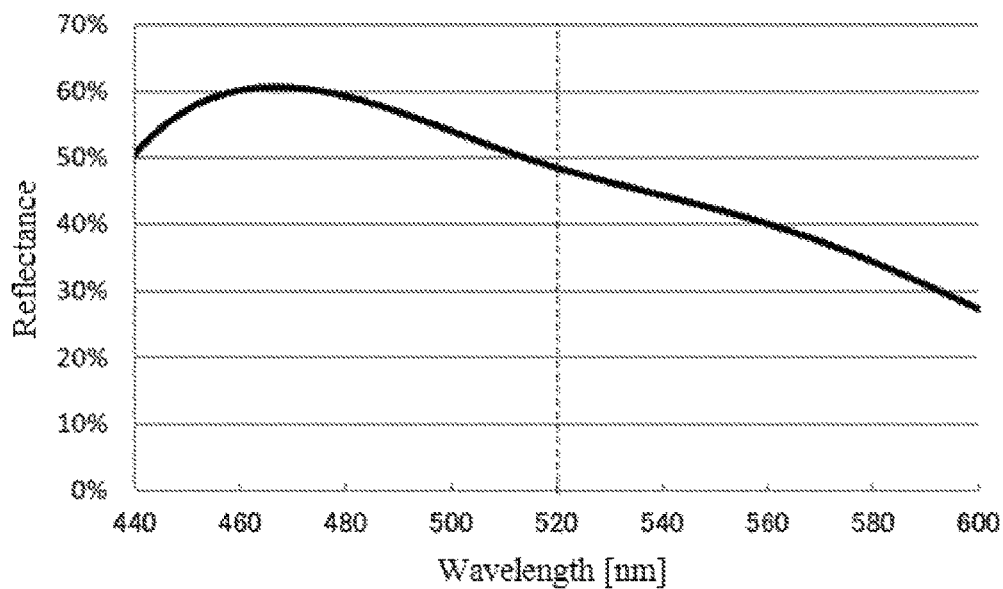
FIG. 6 is a graph showing wavelength dependency of a reflectance of an emission-side mirror in Comparative Example 2.

If the outermost $Al_2O_3$ film 53 has a thickness of 158 nm in the emission-side mirror 50, the $Al_2O_3$ film 53 is a λ/4 film. As shown in FIG. 5, such a film has a reflectance that is almost unchanged at and around the wavelength λo. In view of this, with the emission-side mirror 50 including one or more λ/4 films and at least one non-λ/4 film, the reflectance can be changed in according with an increase in wavelength. Even if the thickness of the $Al_2O_3$ film 53 is further reduced to 130 nm, the $Al_2O_3$ film 53 is a non-λo film, but in this case, the reflectance decreases in accordance with an increase in wavelength at and around the wavelength λo as shown in FIG. 6. In view of this, with a portion of the emission-side mirror 50 being a non-λ/4 film, adjusting the thickness of the non-λ/4 film allows the reflectance to be changed in accordance with an increase in wavelength as shown in FIG. 4.

In the case in which the reflectance decreases in accordance with increase in the wavelength as shown in FIG. 6, the threshold current is reduced at an emission wavelength in a short wavelength range, in which the reflectance is relatively high, and the threshold current is increased at an emission wavelength in a longer wavelength range, in which the reflectance is relatively low. Thus, variation in the threshold current varies tends to be increased as compared to a case in which the emission-side mirror 50 according to the present embodiment is used. Further, that the longer the emission wavelength is, the smaller the reflectance is, as shown in FIG. 6, indicates that the longer the emission wavelength is, the smaller the optical confinement is. Decrease in the optical output is greater in a high-temperature atmosphere than in a low-temperature atmosphere, and the degree of the decrease may be smaller when optical confinement is higher particularly in a long wavelength range. Thus, with respect to light in a long wavelength range, e.g., 525 nm or more, it is preferable that, as shown in FIG. 4, the longer the wavelength is, the higher a reflectance of the emission-side mirror 50 is, rather than, as shown in FIG. 6, that the longer the wavelength is, the lower the reflectance is.

In addition, it is considered that, the greater the number of non-λ/4 films, the greater the number of change points in wavelength dependency or angle dependency is apt to. Thus, the number of non-λ/4 films is preferably small. That is, it is preferable that there are a plurality of λ/4 films, and the number of λ/4 films is larger than the number of non-λ/4 films. More preferably, the number of non-λ/4 films is 1. In addition, change in the thickness of a film disposed relatively close to the nitride semiconductor structure 10 tends to lead to change in the field intensity at an interface between the nitride semiconductor structure 10 and the emission-side mirror 50. The greater the field intensity at the interface is, the more easily the interface and the vicinity thereof are damaged. It is preferable that the non-λ/4 film is the outermost film as shown in FIG. 3B, which hardly affects the field intensity at the interface between the nitride semiconductor structure 10 and the emission-side mirror 50.

The emission-side mirror 50 is formed at such a position that the emission-side mirror 50 covers at least the active layer 12 of the light emission-side surface 10*a*. For example, the emission-side mirror 50 is formed so as to cover the entirety of the light emission-side surface 10*a*. A part of the emission-side mirror 50 may creep up to above and/or below the nitride semiconductor structure 10 as shown in FIG. 3A. In this case, the portion that creeps up to above and/or below the nitride semiconductor structure 10 may have a thickness different from a thickness as described above. The nitride semiconductor structure 10 in the step S202 of forming emission-side mirror may have a bar shape in which a plurality of portions that will become a semiconductor laser element is connected in a direction parallel to the light emission-side surface 10*a*. The bar-shaped nitride semiconductor structure 10 can be obtained by dividing a wafer.

Step S204: Forming Reflection-Side Mirror

After the nitride semiconductor structure 10 is provided, the reflection-side mirror 60 is formed on the light reflection-side surface as shown in FIG. 3A. The step S204 of forming reflection-side mirror may be carried out before or concurrently with the emission-side mirror forming step S202. In a range of $\lambda_o \pm X$ nm, the reflection-side mirror 60 has a reflectance higher than the reflectance of the emission-side mirror 50. Accordingly, the optical output of laser light emitted from the emission-side mirror 50 during laser emission can be higher than the optical output of laser light emitted from the reflection-side mirror 60.

Because the higher the reflectance of reflection-side mirror 60 is, the smaller the threshold current can be, the reflectance of the reflection-side mirror 60 in a range of $\lambda_o \pm X$ nm is preferably 90% or more. The reflection-side mirror 60 preferably has a reflectance of which the amount of change with respect to an increase in wavelength in a range of $\lambda_o \pm X$ nm is smaller as compared to that of the reflectance of the emission-side mirror. Accordingly, the reflection-side mirror 60 can have a similar high reflectance irrespective of the actual wavelength $\lambda a$ in a range of $\lambda_o \pm X$ nm, and therefore variations in threshold current can be reduced. More preferably, the reflection-side mirror 60 has a substantially constant reflectance in a range of $\lambda_o \pm X$ nm.

The reflection-side mirror 60 may have a layered structure in which two or more films having different refractive indices are stacked. The reflection-side mirror 60 is formed by, for example, stacking an $Al_2O_3$ film having a thickness of 158 nm, a $Ta_2O_5$ film having a thickness of 61 nm, six pairs of a $SiO_2$ film having a thickness of 87 nm and a $Ta_2O_5$ film having a thickness of 61 nm, and a $SiO_2$ film having a thickness of 174 nm, in this order from the light reflection-side surface 10*b*. In the present embodiment, the target value of the wavelength $\lambda_o$ is 520 nm, and therefore each of films that form the reflection-side mirror 60 is a $\lambda/4$ film having a thickness that is substantially an integer multiple of $\lambda_o/4n$. As used herein, "n" refers to the refractive index of each film. Each of these values is a target value, and an actual thickness may be slightly deviated from the target value. For example, the actual thickness of each film may be deviated from the target value by about 0 to 10 nm.

Similarly to the emission-side mirror 50, the reflection-side mirror 60 is formed at such a position that the reflection-side mirror 60 covers at least the active layer 12 of the light reflection-side surface 10*b*. For example, the reflection-side mirror 60 is formed so as to cover the entirety of the light reflection-side surface 10*b*. As shown in FIG. 3A, a portion of the reflection-side mirror 60 may creep up to above and/or below the nitride semiconductor structure 10, and the portion that creeps to above and/or below the nitride semiconductor structure 10 may have a thickness different from the above-described thickness. The nitride semiconductor structure 10 in the reflection-side mirror forming step S204 may have a bar shape in which a plurality of portions that forms a semiconductor laser element is connected in a direction parallel to the light reflection-side surface 10*b*.

Other Steps

In the case in which the emission-side mirror 50 and the reflection-side mirror 60 are formed on the bar-shaped structure in which a plurality of portions that forms a semiconductor laser element 100 is connected, dividing the bar-shaped structure into a plurality of semiconductor laser elements 100 can be further performed after completion of formation of the emission-side mirror 50 and the reflection-side mirror 60. Measuring the actual emission wavelength $\lambda a$, and determining a semiconductor laser element as a good product if the actual emission wavelength $\lambda a$ thereof is in a range of $\lambda_o \pm X$ nm may be further performed.

Semiconductor Laser Element 100

Figure 7:
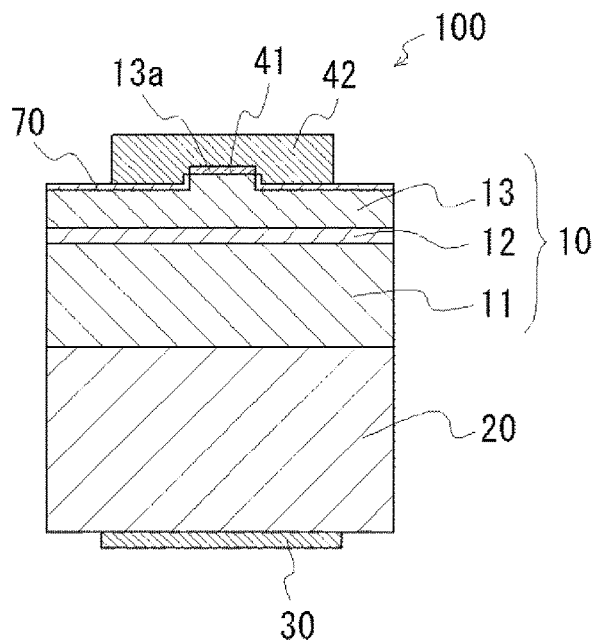
FIG. 7 is a schematic sectional view showing a semiconductor laser element according to one embodiment.

The semiconductor laser element 100 obtained through the above steps is shown in FIG. 7. FIG. 7 shows a cross-section in a direction perpendicular to a resonator direction, i.e. a direction perpendicular to a direction along which the ridge 13*a* extends. The actual emission wavelength $\lambda a$ of the semiconductor laser element 100 is 500 nm or more. As shown in FIG. 7, the semiconductor laser element 100 includes the nitride semiconductor structure 10 having the light emission-side surface 10*a* and the light reflection-side surface 10*b*, the emission-side mirror 50 disposed on the light emission-side surface 10*a*, and the reflection-side mirror 60 disposed on the light reflection-side surface 10*b*. The emission-side mirror 50 has a reflectance that is lower than the reflectance of the reflection-side mirror 60 and increases in accordance with an increase in wavelength, in a wavelength region with a width of 10 nm to 30 nm including the actual emission wavelength $\lambda a$. The emission-side mirror 50 may include a $\lambda/4$ film and a non-$\lambda/4$ film as described above. The $\lambda/4$ film and the non-$\lambda/4$ film may be determined on the basis of the actual emission wavelength $\lambda a$ of the semiconductor laser element 100. That is, where $\lambda$ is a wavelength in a wavelength region with a width of 10 nm to 30 nm including the actual emission wavelength $\lambda a$, the $\lambda/4$ film can refer to a film having a thickness that is substantially an integer multiple of $\lambda/4n$, and the non-$\lambda/4$ film can refer to a film having a thickness that is substantially different from an integer multiple of $\lambda/4n$.

Thus, in view of the possibility that the emission wavelength is deviated from a target value, the emission-side mirror 50 having a reflectance that increases in accordance with reduction of the light emitting efficiency of the nitride semiconductor structure 10 allows for reducing deviation of the threshold current from a target value. Because the longer the wavelength is, the more noticeable the reduction of the light emitting efficiency is, such a configuration may be more effective for the semiconductor laser element 100 having an emission wavelength in a range of 515 to 540 nm.

As shown in FIG. 7, for example, the ridge 13*a* is provided at the upper side of the p-side semiconductor layer 13. A portion of the active layer 12 just below the ridge 13*a* and its vicinity is an optical waveguide region. An insulating film 70 may be disposed on the upper surface of the p-side semiconductor layer 14 successive from the ridge 13*a*. The insulating film 70 can be, for example, a single film or layered film of an oxide or nitride of Si, Al, Zr, Ti, Nb, Ta or the like. The ridge 13*a* is formed before the step S202 of forming the emission-side mirror and the step S204 of forming the reflection-side mirror. That is, in the step S100 of providing nitride semiconductor structure, the nitride semiconductor structure 10 in which the ridge 13a is formed is provided. Similarly, the insulating film 70 can be formed before the step S202 of forming the emission-side mirror and the step S204 of forming the reflection-side mirror.

EXAMPLE

As an example, a semiconductor laser element 100 was prepared as described below.

A GaN substrate in which a c-plane is a growth plane was provided as a base member 20, and an n-side semiconductor layer 11 including a GaN-based semiconductor, an active layer 12 and a p-side semiconductor layer 13 were formed on the base member 20. The composition, the thickness, and the like of each of these semiconductor layers was selected so that semiconductor laser element 100 to be obtained had an emission wavelength of 520 nm. That is, a wavelength $\lambda o$, which is a target value of an emission wavelength, was 520 nm. A portion of the p-side semiconductor layer 13 was removed to form a ridge 13a. Further, an insulating film 70 covering the upper surface of a p-side semiconductor layer 14 on both sides of the ridge 13a, a p-electrode 41 being in contact with the upper surface of the ridge 13a, a p-side pad electrode 42 being in contact with the p-electrode 41, and an n-electrode 30 being in contact with the lower surface of the base member 20 were formed.

A wafer obtained in this manner was divided into a plurality of bar-shaped small pieces. Each small piece had a size that allowed to have a plurality of ridges 13a. Cut surfaces of each small piece that face each other served as a light emission-side surface 10a and a light reflection-side surface 10b, respectively. An emission-side mirror 50 was formed on the light emission-side surface 10a, and a reflection-side mirror 60 was formed on the light reflection-side surface 10b. The emission-side mirror 50 was formed by stacking an $Al_2O_3$ film 51a having a thickness of 79 nm, a $ZrO_2$ film 52 having a thickness of 59 nm, an $Al_2O_3$ film 51b having a thickness of 79 nm, a $ZrO_2$ film 52 having a thickness of 59 nm, an $Al_2O_3$ film 51b having a thickness of 79 nm, a $ZrO_2$ film 52 having a thickness of 59 nm and an $Al_2O_3$ film 53 having a thickness of 180 nm, in this order from the light emission-side surface 10a. That is, in the present example, the last film of the emission-side mirror 50 was a film thicker than a $\lambda/4$ film. The thickness of each of these films is a predetermined value. Wavelength dependency of the reflectance of the emission-side mirror 50, which is calculated using these predetermined values, is shown in FIG. 4. In addition, the reflection-side mirror 60 was formed by stacking an $Al_2O_3$ film having a thickness of 158 nm, a $Ta_2O_5$ film having a thickness of 61 nm, six pairs of a $SiO_2$ film having a thickness of 87 nm and a $Ta_2O_5$ film having a thickness of 61 nm, and a $SiO_2$ film having a thickness of 174 nm, in this order from the light reflection-side surface 10b. The reflectance of the reflection-side mirror 60, which was calculated using these predetermined values was about 97% in a wavelength range of 500 to 550 nm.

Figure 8:
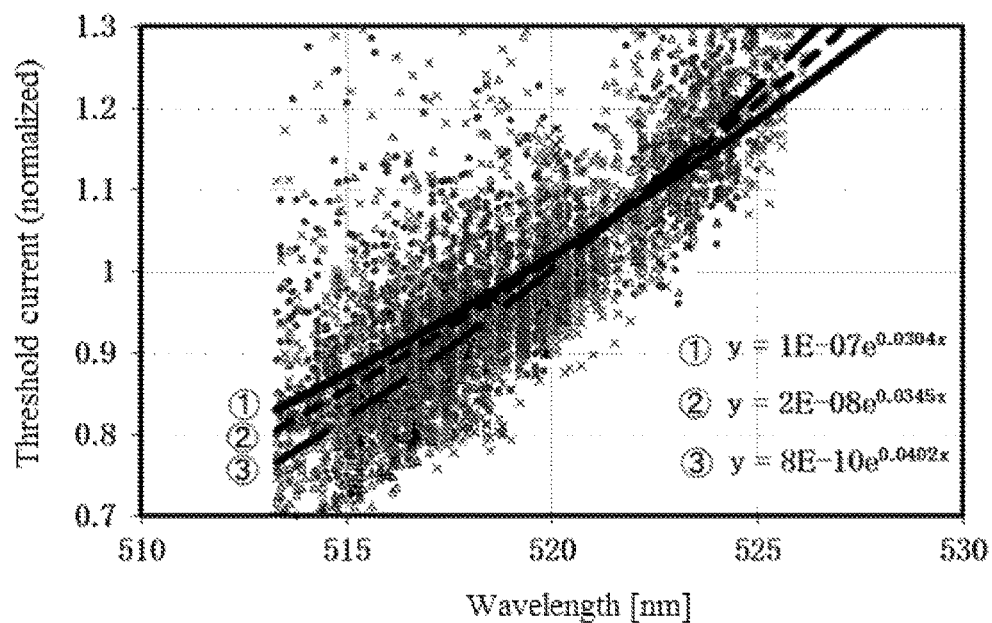
FIG. 8 is a graph showing a relationship between an emission wavelength and a threshold current for a semiconductor laser element in the example.

Each of the small pieces on which the emission-side mirror 50 and the reflection-side mirror 60 was disposed was divided for each ridge 13a to obtain the semiconductor laser element 100 having a single ridge 13a. With respect to each of approximately 1560 semiconductor laser elements 100 obtained from a single wafer, the emission wavelength and the threshold current were measured. With respect to the obtained threshold current values, an average value of threshold currents at an emission wavelength of 520 nm±1 nm was calculated, and the threshold currents were normalized using the average value. That is, the value of each threshold current was divided by the average value. The results thereof are shown in FIG. 8. FIG. 8 is a graph in which the normalized threshold currents are plotted and an appropriate curve was shown. In FIG. 8, values of the threshold current in the present example are each indicated by a circle, and an approximate curve is indicated by a solid line. The emission wavelength was distributed in a range of 513 to 525 nm.

Comparative Example 1

In Comparative Example 1, a semiconductor laser element was prepared in the same manner as in the example except that the predetermined value of the thickness of the $Al_2O_3$ film 53 that was the last film of the emission-side mirror 50 was 158 nm. That is, in Comparative Example 1, the last film of the emission-side mirror 50 was a $\lambda/4$ film. FIG. 5 shows wavelength dependency of the reflectance of the emission-side mirror 50 as calculated using this set value. For each of 1870 semiconductor laser elements of Comparative Example 1, which were obtained from a single wafer, the emission wavelength and the threshold current were measured. FIG. 8 show a result of normalization of the obtained values of threshold currents using an average value of threshold currents at an emission wavelength of 520 nm±1 nm. In FIG. 8, values of threshold currents in Comparative Example 1 are each indicated by x, and an approximate curve is indicated by a broken line. The emission wavelength was distributed in a range of 513 to 527 nm.

Comparative Example 2

In Comparative Example 2, a semiconductor laser element was prepared in the same manner as in the example except that the predetermined value of the thickness of the $Al_2O_3$ film 53, which was the last film of the emission-side mirror 50, was 130 nm. That is, in Comparative Example 2, the last film of the emission-side mirror 50 was a film thinner than a $\lambda/4$ film. FIG. 6 shows wavelength dependency of the reflectance of the emission-side mirror 50 calculated using the predetermined thickness. For each of 1750 semiconductor laser elements of Comparative Example 2, which were obtained from a single wafer, the emission wavelength and the threshold current were measured. FIG. 8 show results of normalization of the obtained threshold currents using an average value of threshold currents at an emission wavelength of 520 nm±1 nm. In FIG. 8, values in Comparative Example 2 are each indicated by a triangle, and an approximate curve is indicated by a broken line having intervals wider than those in Example 1. The emission wavelength was distributed in a range of 513 to 525 nm.

As shown in FIG. 8, variations in threshold current of the semiconductor laser element 100 of the example were smaller than variations in threshold current of the semiconductor laser element of each of Comparative Examples 1 and 2. Three equations: (1), (2) and (3) in FIG. 8 are the equations of the approximate curves in the example, Comparative Example 1 and Comparative Example 2, respectively.

Figure 9:
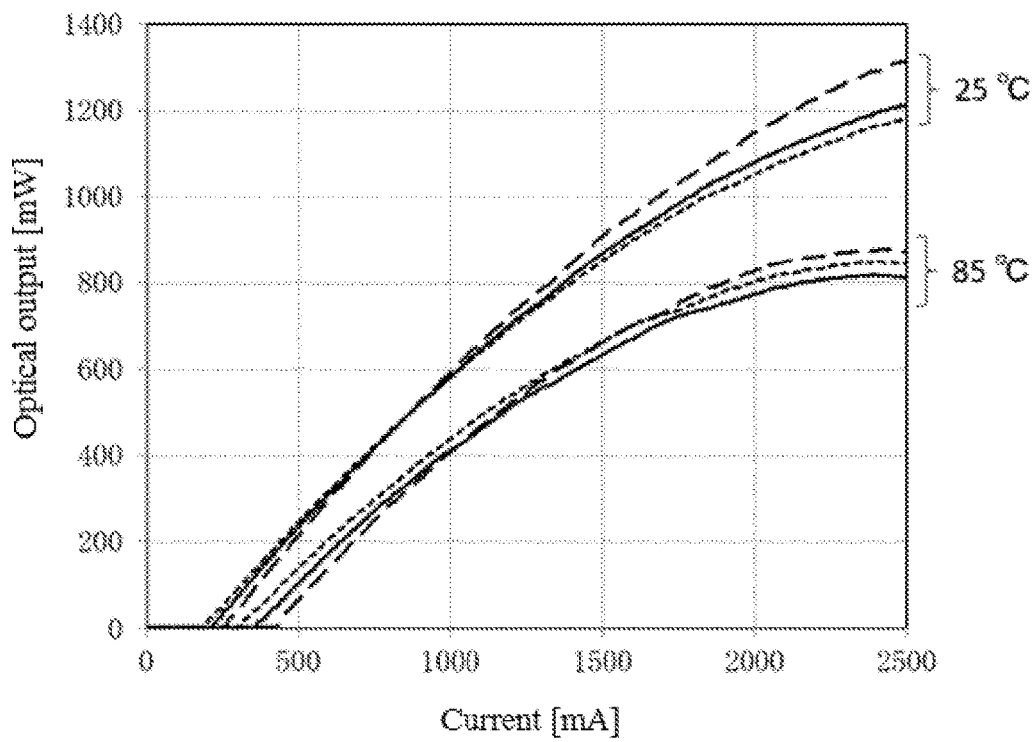
FIG. 9 is a graph showing a relationship between a current and an optical output for a semiconductor laser element having an emission wavelength of 520 nm in each of the example and Comparative Examples 1 and 2.
Figure 10:
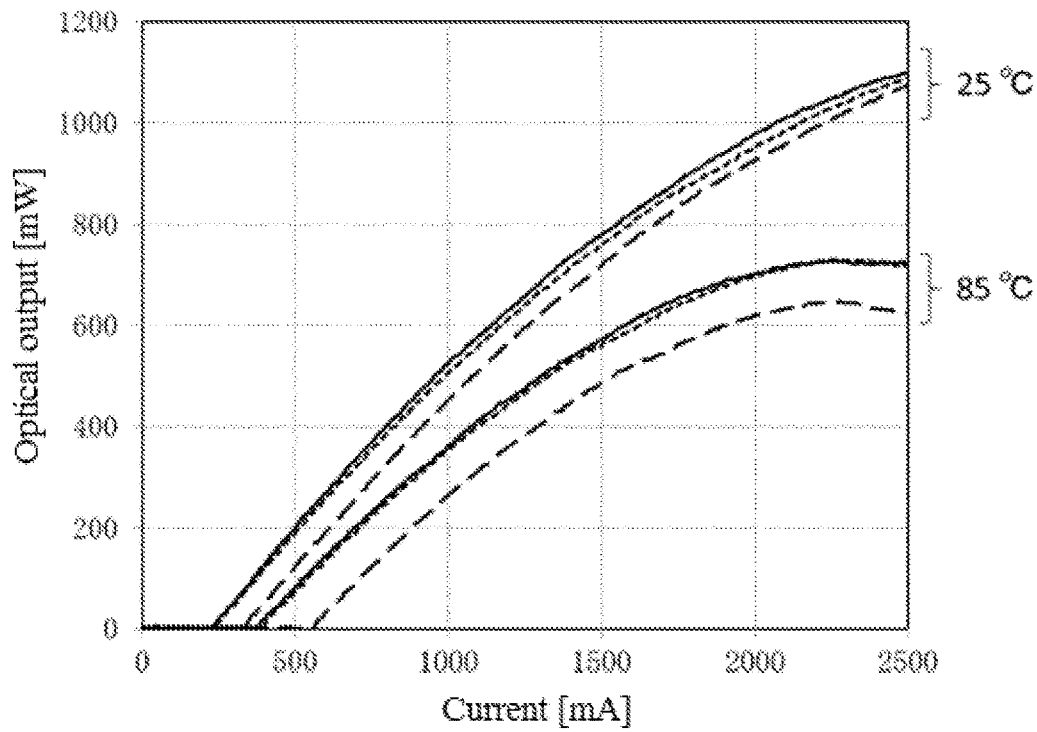
FIG. 10 is a graph showing a relationship between a current and an optical output for a semiconductor laser element having an emission wavelength of 525 nm in each of the example and Comparative Examples 1 and 2.

In addition, a semiconductor laser element with an emission wavelength of 520 nm and a semiconductor laser element with an emission wavelength of 525 nm were selected from each of the example and Comparative Examples 1 and 2, and the optical output of each of the semiconductor laser elements was measured while the current was changed. The measurement was performed at each of case temperatures $T_c$ of 25° C. and 85° C. The results thereof are shown in FIGS. 9 and 10. FIG. 9 shows results of the semiconductor laser element at an emission wavelength of 520 nm, and FIG. 10 shows results of the semiconductor laser element an emission wavelength of 525 nm. In FIGS. 9 and 10, results in the example are each indicated by a solid line, results in Comparative Example 1 are each indicated by a broken line, and results in Comparative Example 2 are each indicated by a broken like having intervals wider than those in Comparative Example 1. As shown in FIGS. 9 and 10, the optical output of the semiconductor laser element with the emission wavelength of 520 nm having a structure according to Comparative Example 2 was similar to or higher than the optical output of each of those with the emission wavelength of 520 nm having structures according to the example and Comparative Example 1, but the optical output of the semiconductor laser element with the emission wavelength of 525 nm having a structure according to Comparative Example 2 was lower than the optical output of each of those with the emission wavelength of 520 nm having structures according to the example and Comparative Example 1. In particular, difference in optical output between Comparative Example 2 and each of the example and Comparative example 1 was greater when a case temperature $T_c$ was 85° C. As shown in FIG. 8, in Comparative Example 2, the wavelength dependency of the threshold current is higher as compared to the example and Comparative example 1, i.e. the ratio of increase in threshold current with an increase in wavelength is apt to be higher as compared to the example and Comparative example 1. Thus, it is considered that in a semiconductor laser element with a long emission wavelength of, for example, 525 nm or more, the optical output is reduced due to high threshold current. Therefore, the degree of reduction in optical output in a high-temperature atmosphere can be reduced more greatly in the example than in Comparative Example 2.

DENOTATION OF REFERENCE NUMERALS

100 Semiconductor laser element
10 Nitride semiconductor structure
10a Light emission-side surface
10b Light reflection-side surface
11 n-side semiconductor layer
12 Active layer
13 p-side semiconductor layer
13a Ridge
20 Base member
30 n-electrode
41 p-electrode
42 p-side pad electrode
50 Emission-side mirror
51a, 51b $Al_2O_3$ film ($\lambda/4$ film)
52 $ZrO_2$ film ($\lambda/4$ film)
53 $Al_2O_3$ film (non-$\lambda/4$ film)
60 Reflection-side mirror
70 Insulating film

What is claimed is:

1. A method of manufacturing a semiconductor laser element, the method comprising:
   providing a nitride semiconductor structure with a target emission wavelength $\lambda o$, the nitride semiconductor structure having a light emission-side surface and a light reflection-side surface;
   forming an emission-side mirror on the light emission-side surface; and
   forming a reflection-side mirror on the light reflection-side surface,
   wherein the semiconductor laser element has an actual wavelength $\lambda a$, which is 500 nm or more and is in a range of $\lambda o \pm X$ nm ($5 \leq X \leq 15$), and
   wherein a reflectance of the emission-side mirror is lower than a reflectance of the reflection-side mirror and increases in accordance with an increase in wavelength in a range of $\lambda o \pm X$ nm.

2. The method of manufacturing a semiconductor laser element according to claim 1, wherein:
   the emission-side mirror is formed so as to include a layered structure in which two or more films having different refractive indices are stacked, the two or more films including:
   one or more $\lambda/4$ films each having a thickness that is substantially an integer multiple of $\lambda o/4n$, and
   at least one non-$\lambda/4$ film having a thickness that is substantially different from an integer multiple of $\lambda o/4n$, where n is a refractive index of each film.

3. The method of manufacturing a semiconductor laser element according to claim 2, wherein the number of the $\lambda/4$ films in the emission-side mirror is larger than the number of the non-$\lambda/4$ films in the emission-side mirror.

4. The method of manufacturing a semiconductor laser element according to claim 3, wherein the emission-side mirror includes one non-$\lambda/4$ film.

5. The method of manufacturing a semiconductor laser element according to claim 4, wherein the non-$\lambda/4$ film is an outermost film of the emission-side mirror.

6. The method of manufacturing a semiconductor laser element according to claim 1, wherein the emission-side mirror has a reflectance that changes by 2% or more for every 10 nm increase in wavelength, in a range of $\lambda o \pm X$ nm.

7. The method of manufacturing a semiconductor laser element according to claim 1, wherein the reflection-side mirror has a reflectance in which an amount of change in accordance with an increase in wavelength in a range of $\lambda o \pm X$ nm is smaller than an amount of change of a reflectance of the emission-side mirror in accordance with an increase in wavelength in a range of $\lambda o \pm X$ nm.

8. The method of manufacturing a semiconductor laser element according to claim 7, wherein the reflection-side mirror has a substantially constant reflectance in a range of $\lambda o \pm X$ nm.

9. The method of manufacturing a semiconductor laser element according to claim 1, wherein X is 15.

10. The method of manufacturing a semiconductor laser element according to claim 1, wherein the actual emission wavelength $\lambda a$ is in a range of 515 nm to 540 nm.

11. A semiconductor laser element having an emission wavelength of 500 nm or more, the semiconductor laser element comprising:
    a nitride semiconductor structure having a light emission-side surface and a light reflection-side surface;
    an emission-side mirror disposed on the light emission-side surface; and
    a reflection-side mirror disposed on the light reflection-side surface,
    wherein a reflectance of the emission-side mirror is lower than a reflectance of the reflection-side mirror and increases in accordance with an increase in wavelength in a wavelength region that has a width of 10 nm to 30 nm and includes the emission wavelength.

12. The semiconductor laser element according to claim 11, wherein:
   the emission-side mirror includes a layered structure in which two or more films having different refractive indices are stacked, the two or more films including:
   one or more $\lambda/4$ films each having a thickness that is substantially an integer multiple of $\lambda/4n$, and
   at least one non-$\lambda/4$ film having a thickness that is substantially different from an integer multiple of $\lambda/4n$, where $\lambda$ is a wavelength within the wavelength region, and n is a refractive index of each film.

13. The semiconductor laser element according to claim 12, wherein the emission-side mirror includes one non-$\lambda/4$ film.

14. The semiconductor laser element according to claim 13, wherein the non-$\lambda/4$ film is an outermost film of the emission-side mirror.

15. The semiconductor laser element according to claim 11, wherein the emission-side mirror has a reflectance that changes by 2% or more for every 10 nm increase in wavelength in the wavelength region.

16. The semiconductor laser element according to claim 11, wherein the reflection-side mirror has a substantially constant reflectance in the wavelength region.

17. The semiconductor laser element according to claim 11, wherein the emission wavelength is in a range of 515 to 540 nm.

* * * * *